(12) United States Patent
Chen et al.

(10) Patent No.: US 11,632,095 B2
(45) Date of Patent: Apr. 18, 2023

(54) WAFER LEVEL SURFACE ACOUSTIC WAVE FILTER AND PACKAGE METHOD

(71) Applicant: Spreadtrum Communications (Shanghai) Co., Ltd., Shanghai (CN)

(72) Inventors: Jing Chen, Shanghai (CN); Cong Liang, Shanghai (CN)

(73) Assignee: Spreadtrum Communications (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/544,124

(22) Filed: Dec. 7, 2021

(65) Prior Publication Data

US 2022/0094328 A1   Mar. 24, 2022

Related U.S. Application Data

(63) Continuation of application No. PCT/CN2021/098266, filed on Jun. 4, 2021.

(30) Foreign Application Priority Data

Aug. 7, 2020   (CN) .......................... 202010787875.6

(51) Int. Cl.
*H03H 9/10* (2006.01)
*H03H 9/02* (2006.01)
(Continued)

(52) U.S. Cl.
CPC ...... *H03H 9/1064* (2013.01); *H03H 9/02834* (2013.01); *H03H 9/1071* (2013.01);
(Continued)

(58) Field of Classification Search
CPC ............ H03H 9/1064; H03H 9/02834; H03H 9/1071; H03H 9/1092; H03H 9/15; H03H 9/6423
(Continued)

(56) References Cited

U.S. PATENT DOCUMENTS

| 7,230,512 B1 | 6/2007 | Carpenter et al. |
| 7,459,829 B2 * | 12/2008 | Aoki ........................ H03H 3/08 333/195 |

(Continued)

FOREIGN PATENT DOCUMENTS

| CN | 202103092 U | 1/2012 |
| CN | 102820869 A | 12/2012 |

(Continued)

OTHER PUBLICATIONS

International Search Report and Written Opinion for PCT Application No. PCT/CN2021/098266 dated Aug. 26, 2021.

(Continued)

*Primary Examiner* — Rakesh B Patel
*Assistant Examiner* — Jorge L Salazar, Jr.
(74) *Attorney, Agent, or Firm* — Maschoff Brennan; Brent A. Johnson; Yuefen Zhou

(57) ABSTRACT

Embodiments of the present application provide a wafer level surface acoustic wave filter and a package method, the surface acoustic wave filter includes a wafer, an electrode layer, a supporting wall and a cover plate; wherein, the wafer includes a substrate layer and a piezoelectric thin film layer combined together by wafer bonding, the electrode layer is arranged on a surface of the piezoelectric thin film layer, the supporting wall surrounds between the piezoelectric thin film layer and the cover plate to form a sealed cavity; and the cover plate includes at least a first material layer, which uses the same material as the substrate layer.

12 Claims, 5 Drawing Sheets

(51) Int. Cl.
*H03H 9/15* (2006.01)
*H03H 9/64* (2006.01)

(52) U.S. Cl.
CPC ............ *H03H 9/1092* (2013.01); *H03H 9/15* (2013.01); *H03H 9/6423* (2013.01)

(58) Field of Classification Search
USPC ........................................ 333/133, 193–196
See application file for complete search history.

(56) References Cited

U.S. PATENT DOCUMENTS

| | | |
|---|---|---|
| 2007/0296304 A1 | 12/2007 | Fujii et al. |
| 2009/0224851 A1 | 9/2009 | Feiertag et al. |
| 2010/0301703 A1* | 12/2010 | Chen .................. H03H 9/02244 29/25.35 |
| 2011/0146041 A1* | 6/2011 | Miyake .................... H03H 3/02 29/25.35 |
| 2014/0339957 A1 | 11/2014 | Tajima et al. |
| 2016/0248398 A1 | 8/2016 | Kuroyanagi |
| 2017/0033764 A1 | 2/2017 | Inoue et al. |
| 2017/0213788 A1* | 7/2017 | Shimanuki .............. H01L 24/48 |
| 2019/0221607 A1 | 7/2019 | Gudeman |
| 2019/0245515 A1 | 8/2019 | Hurwitz et al. |
| 2019/0386640 A1 | 12/2019 | Akiyama et al. |
| 2020/0153409 A1 | 5/2020 | Hsu et al. |

FOREIGN PATENT DOCUMENTS

| | | |
|---|---|---|
| CN | 103117724 A | 5/2013 |
| CN | 106301283 A | 1/2017 |
| CN | 206195735 U | 5/2017 |
| CN | 107493086 A | 12/2017 |
| CN | 107919862 A | 4/2018 |
| CN | 108155287 A | 6/2018 |
| CN | 108233890 A | 6/2018 |
| CN | 110247639 A | 9/2019 |
| CN | 110993570 A | 4/2020 |
| CN | 110995189 A | 4/2020 |
| CN | 111147040 A | 5/2020 |
| CN | 111313861 A | 6/2020 |
| CN | 111326482 A | 6/2020 |
| CN | 111786647 A | 10/2020 |
| JP | 2016123016 A | 7/2016 |

OTHER PUBLICATIONS

The First Office Action issued by the China National Intellectual Property Administration (CNIPA) dated Feb. 3, 2021 for the Chinese Patent Application No. 202010787875.6.
Wang, X. et al., Surface Acoustic Wave Filters Based on Wafer Level Chip Scale Package, Electronics & Packaging, 19(7), 1-3 and 32, Jul. 2019.
Mi, J. et al., Overview of the Development of SAW Miniaturization Technology, Piezoelectrics & Acoustooptics, 34(1), 4-6, Feb. 2012.
The Notification to Grant Patent Right for Invention issued by the China National Intellectual Property Administration (CNIPA) dated May 8, 2021 for the Chinese Patent Application No. 202010787875.6.
Wang, J. et al., 4E-6 Thermal Effect of Surface Acoustic Waves in Quartz Substrates Covered by a Metal Layer, 2007 IEEE Ultrasonics Symposium Proceedings, 288-291, Dec. 2007.
Lu, D. et al., Study on Wafer Bonding Technology of SAW Devices, 42(3), 361-364, Jun. 2020.
Extended European Search Report for European Patent Application No. 21802176.4, dated Aug. 5, 2022.

\* cited by examiner

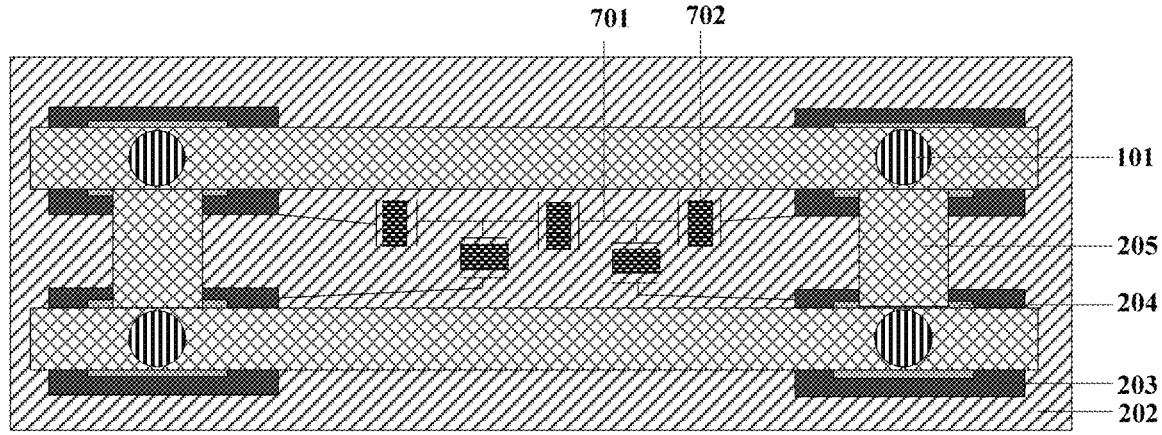

FIG. 7

```
┌─────────────────────────────────────────────────────────────┐
│ Obtaining a wafer, the wafer including a substrate layer    │── S801
│ and a piezoelectric thin film layer, and the substrate layer│
│ and the piezoelectric thin film layer being combined        │
│ together by wafer bonding therebetween                      │
└─────────────────────────────────────────────────────────────┘
                              │
                              ▼
┌─────────────────────────────────────────────────────────────┐
│ Preparing an electrode layer on the piezoelectric thin film │── S802
│ layer                                                       │
└─────────────────────────────────────────────────────────────┘
                              │
                              ▼
┌─────────────────────────────────────────────────────────────┐
│ Preparing a supporting wall on the piezoelectric thin film  │── S803
│ layer                                                       │
└─────────────────────────────────────────────────────────────┘
                              │
                              ▼
┌─────────────────────────────────────────────────────────────┐
│ Obtaining a cover plate, the cover plate including a first  │── S804
│ material layer, and the first material layer using the same │
│ material as the substrate layer                             │
└─────────────────────────────────────────────────────────────┘
                              │
                              ▼
┌─────────────────────────────────────────────────────────────┐
│ Sealing the supporting wall and the cover plate, so that the│── S805
│ supporting wall surrounds between the piezoelectric thin    │
│ film layer and the cover plate to form a sealed cavity      │
└─────────────────────────────────────────────────────────────┘
```

FIG. 8

WAFER LEVEL SURFACE ACOUSTIC WAVE FILTER AND PACKAGE METHOD

CROSS-REFERENCE TO RELATED APPLICATIONS

This application is a continuation of International Patent Application No. PCT/CN2021/098266, filed Jun. 4, 2021; which claims priority to Chinese Patent Application No. 202010787875.6, filed Aug. 7, 2020; both of the above applications are hereby incorporated by reference in their entireties.

TECHNICAL FIELD

Embodiments of the present disclosure relate to the technical field of semiconductor, and in particular, to a wafer level surface acoustic wave filter and a package method.

BACKGROUND

A surface acoustic wave filter has characteristics of high working frequency, wide band pass, good frequency selection characteristics, small size and light weight, and it can use the same production process as an integrated circuit, with easy manufacturability, low cost, and good consistent frequency characteristics, and therefore, it is widely used in various electronic devices.

At present, with the disclosure of 5G core technologies, such as Carrier Aggregation (abbreviated as CA), Massive MIMO, and Quadrature Amplitude Modulation (abbreviated as QAM), the number of RF front-end components has not only increased substantially, but also increasingly stringent technical requirements have been put forward for the performance of filter components, for example, it is required to have better temperature stability and a smaller package size, in order to be highly integrated with an active device such as a power amplifier and an RF switch in the RF front-end. Therefore, how to design a filter component with smaller size and higher stability is an urgent problem to be solved.

SUMMARY

Embodiments of the present disclosure provide a wafer level surface acoustic wave filter and a package method, which can effectively improve the temperature stability of the surface acoustic wave filter and reduce the size of the surface acoustic wave filter.

In a first aspect, embodiments of the present disclosure provide a wafer level surface acoustic wave filter, including: a wafer, an electrode layer, a supporting wall and a cover plate; where the wafer includes a substrate layer and a piezoelectric thin film layer, and the substrate layer and the piezoelectric thin film layer are combined together by wafer bonding therebetween.

The electrode layer is arranged on a surface of the piezoelectric thin film layer, the supporting wall is located between the piezoelectric thin film layer and the cover plate, and the supporting wall surrounds between the piezoelectric thin film layer and the cover plate to form a sealed cavity.

The cover plate includes at least a first material layer, and the first material layer uses the same material as the substrate layer.

In a feasible implementation, a ratio of a thickness of the piezoelectric thin film layer to a thickness of the wafer is less than a preset threshold.

In a feasible implementation, a value of the preset threshold is 0.1.

In a feasible implementation, the cover plate includes at least two material layers, and a thickness of each material layer is related to a temperature expansion coefficient of each material layer.

In a feasible implementation, the cover plate includes the first material layer and a second material layer, the first material layer and the second material layer are combined together by wafer bonding therebetween; the second material layer is located on a side of the cover plate close to the sealed cavity; and the second material layer uses the same material as the piezoelectric thin film layer.

In a feasible implementation, the cover plate includes the first material layer, a second material layer and a third material layer; the third material layer is located between the first material layer and the second material layer, and the first material layer and the second material layer are combined together by using the third material layer; the second material layer is located on a side of the cover plate close to the sealed cavity; and the second material layer uses the same material as the piezoelectric thin film layer.

In a feasible implementation, a material used for the third material layer is an organic binder.

In a feasible implementation, the electrode layer includes an interdigital electrode and a thickened electrode, and the thickened electrode is distributed in at least one of following positions of the interdigital electrode: an input position, an output position, and a grounding position.

In a feasible implementation, at least one solder ball is further included, the solder ball penetrates the cover plate and the supporting wall in a through silicon via (TSV) manner and then electrically contacts the electrode layer; or, the solder ball is electrically connected with the electrode layer in a redistribution layer (RDL) manner.

In a feasible implementation, the piezoelectric thin film layer is made from at least one of following materials: lithium tantalate $LiTaO_3$ and lithium niobate $LiNbO_3$.

In a feasible implementation, the substrate layer is made from at least one of following materials: silicon Si and sapphire.

In a second aspect, embodiments of the present disclosure provide a package method for a wafer level surface acoustic wave filter, including:

obtaining a wafer, where the wafer includes a substrate layer and a piezoelectric thin film layer, and the substrate layer and the piezoelectric thin film layer are combined together by wafer bonding therebetween;

preparing an electrode layer on the piezoelectric thin film layer;

preparing a supporting wall on the piezoelectric thin film layer;

obtaining a cover plate, where the cover plate includes at least a first material layer, and the first material layer uses the same material as the substrate layer;

sealing the supporting wall and the cover plate, so that the supporting wall surrounds between the piezoelectric thin film layer and the cover plate to form a sealed cavity.

In a feasible implementation, a ratio of a thickness of the piezoelectric thin film layer to a thickness of the wafer is less than a preset threshold.

In a feasible implementation, a value of the preset threshold is 0.1.

In a feasible implementation, the cover plate includes at least two material layers, and a thickness of each material layer is related to a temperature expansion coefficient of each material layer.

In a feasible implementation, the cover plate includes the first material layer and a second material layer, the first material layer and the second material layer are combined together by wafer bonding therebetween, and the second material layer uses the same material as the piezoelectric thin film layer.

In a feasible implementation, the cover plate includes the first material layer, a second material layer and a third material layer; the third material layer is located between the first material layer and the second material layer, and the first material layer and the second material layer are combined together by using the third material layer; and the second material layer uses the same material as the piezoelectric thin film layer.

In a feasible implementation, the package method further includes:

forming a via hole which penetrates the cover plate and the supporting wall in a through silicon via (TSV) manner at a preset position of the cover plate, and implanting a solder ball in the via hole by electroplating, the solder ball electrically contacting the electrode layer.

Embodiments of the present disclosure provide a wafer level surface acoustic wave filter and a package method, the surface acoustic wave filter includes a wafer, an electrode layer, a supporting wall and a cover plate; where, the wafer includes a substrate layer and a piezoelectric thin film layer combined together by wafer bonding, the electrode layer is arranged on a surface of the piezoelectric thin film layer, the supporting wall is located between the piezoelectric thin film layer and the cover plate, and the supporting wall surrounds between the piezoelectric thin film layer and the cover plate to form a sealed cavity; the cover plate includes at least a first material layer, which uses the same material as the substrate layer. In the embodiments of the present disclosure, through the use of wafer level package, the size of the surface acoustic wave filter can be effectively reduced; the substrate layer and the piezoelectric thin film layer are combined together by wafer bonding, the performance of the surface acoustic wave filter based on this type of wafer is less affected by temperature; and the cover plate uses the same or similar material as the wafer, which can enhance the reliability and temperature stability of a device.

BRIEF DESCRIPTION OF THE DRAWINGS

In order to illustrate technical solutions in the embodiments of the present disclosure more clearly, the following will briefly introduce drawings that need to be used in the description of the embodiments of the present disclosure. Obviously, the drawings in the following description are some embodiments of the present disclosure, and for those skilled in the art, other drawings can be obtained based on these drawings without creative work.

FIG. 7 is a transversely sectional view of a wafer level surface acoustic wave filter in an embodiment of the present disclosure;

FIG. 8 is a schematic flow diagram I of a package method for a wafer level surface acoustic wave filter in an embodiment of the present disclosure;

DESCRIPTION OF EMBODIMENTS

In order to make the objective, technical solutions and advantages of the present disclosure more clear, the technical solutions in embodiments of the present disclosure are described clearly and completely in combination with the accompanying drawings in the embodiments of the present disclosure hereinafter. Obviously, the described embodiments are a part of the embodiments of the present disclosure, but not all of the embodiments. Based on the embodiments in the present disclosure, all other embodiments obtained by those skilled in the art without creative work shall fall within the protection scope of the present disclosure.

The package of existing surface acoustic wave filters is mostly completed by etching substrate material of chips, which is difficult to process, and it is difficult to meet the current requirements for the size and stability of surface acoustic wave filters.

In order to solve the above problem, an embodiment of the present disclosure provides a wafer level surface acoustic wave filter, the use of wafer level package can effectively reduce the size of the surface acoustic wave filter, which can be suitable for packaging RF front-end module; additionally, the substrate layer and the piezoelectric thin film layer are combined together by wafer bonding, which can improve the temperature stability of the surface acoustic wave filter; and, the cover plate uses the same or similar material as the substrate layer, thereby further enhancing the reliability of the surface acoustic wave filter, and reducing the influence of temperature changes on the surface acoustic wave filter. The present disclosure is described in detail through the following examples.

Figure 1:
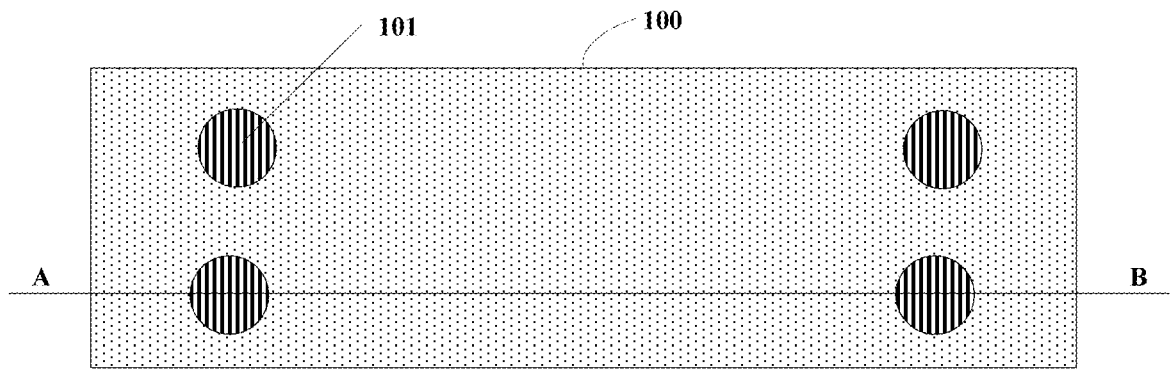
FIG. 1 is a schematic top view of a package structure of a wafer level surface acoustic wave filter in an embodiment of the present disclosure.

Referring to FIG. 1, FIG. 1 is a schematic top view of a package structure of a wafer level surface acoustic wave filter in an embodiment of the present disclosure. In FIG. 1, a package structure 100 of the abovementioned surface acoustic wave filter includes a number of solder balls 101. The package structure can be applied to the wafer-level package of the surface acoustic wave filter, so as to achieve the protection of a working surface of the surface acoustic wave filter and the extraction of electrodes.

In this case, after the package structure shown in FIG. 1 is packaged, a number of surface acoustic wave filter components can be obtained by cutting.

Figure 2:
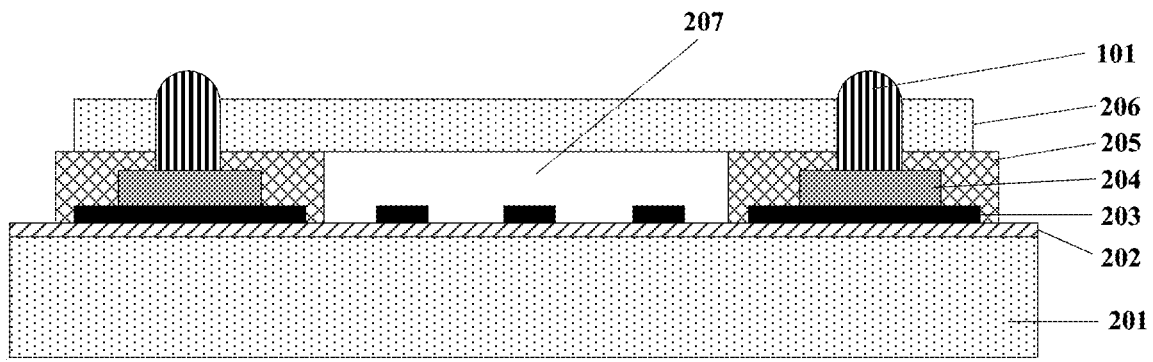
FIG. 2 is a schematic sectional view I of a package structure of a surface acoustic wave filter taken along a section line AB shown in FIG. 1.

Referring to FIG. 2, FIG. 2 is a schematic sectional view I of a package structure of a surface acoustic wave filter taken along a section line AB shown in FIG. 1. In this case, the section shown in FIG. 2 can be considered as a schematic view of a cross-sectional structure of a surface acoustic wave filter.

In FIG. 2, the surface acoustic wave filter includes a wafer, an electrode layer, a supporting wall 205 and a cover plate. In this case, the abovementioned wafer includes a substrate layer 201 and a piezoelectric thin film layer 202, and the substrate layer 201 and the piezoelectric thin film layer 202 are combined together by wafer bonding therebetween. Since a thickness of the piezoelectric thin film layer 202 is less than a preset threshold, the temperature expansion coefficient of the wafer after bonding is close to the temperature expansion coefficient of the substrate layer 201.

It should be noted that the thickness of each material layer of the surface acoustic wave filter shown in FIG. 2 is only for exemplary illustration, and does not represent an actual thickness.

In this case, a way of wafer bonding means that two mirror-polished homogenous or heterogeneous wafers are closely combined through chemical and physical action. After the wafers are bonded, atoms at the interface are subjected to external forces to react, so as to form covalent bonds for combining together, so that a bonding interface reaches a specific bonding strength. In the present embodiment, the use of wafer bonding way is conducive to achieving a low temperature drift and improving the power tolerance performance of the surface acoustic wave filter.

The abovementioned electrode layer includes an interdigital electrode 203 and a thickened electrode 204, and the thickened electrode 204 is distributed in at least one of following positions of the interdigital electrode 203: an input position, an output position, and a grounding position.

In this case, the abovementioned interdigital electrode 203 is arranged on a surface of the piezoelectric thin film layer 202. In an implementation, the interdigital electrode 203 and the thickened electrode 204 can be formed on the surface of the piezoelectric thin film layer 202 by photoetching method.

The supporting wall 205 is located between the piezoelectric thin film layer 202 and the cover plate, and the supporting wall 205 surrounds between the piezoelectric thin film layer 202 and the cover plate to form a sealed cavity 207.

In this case, the cover plate can include only one layer of material, i.e., a first material layer 206, and the first material layer 206 uses the same material as the substrate layer 201.

In an implementation, the substrate layer 201 can be made from silicon Si and sapphire, etc., with a thickness of $30\lambda$-$150\lambda$, where $\lambda$ is a wavelength of a surface acoustic wave.

In an implementation, the piezoelectric thin film layer 202 can be made from film material with piezoelectric performance, such as lithium tantalate $LiTaO_3$ and lithium niobate $LiNbO_3$, etc., with a thickness of $0.05\lambda$-$15\lambda$, where $\lambda$ is a wavelength of a surface acoustic wave.

Exemplarily, the substrate layer 201 and the piezoelectric thin film layer 202 can be a combination of the following materials:

$LiTaO_3$ and Si, $LiNbO_3$ and Si, $LiTaO_3$ and sapphire, $LiNbO_3$ and sapphire.

In an implementation, the electrode layer can be made from aluminum, copper, gold, aluminum-copper alloy, etc., with a thickness of $6\%\lambda$~$15\%\lambda$ where $\lambda$ is a wavelength of a surface acoustic wave.

In an implementation, the supporting wall 205 can be made from viscous materials, which can surround the electrode layer.

In this case, a ratio of a thickness of the piezoelectric thin film layer 202 to that of the wafer is less than a preset threshold. For example, a ratio of the thickness of the piezoelectric thin film layer to that of the wafer is less than 0.1.

It will be appreciated that, since the $LiTaO_3$ or $LiNbO_3$ used in the piezoelectric thin film layer 202 has a relatively large temperature expansion coefficient, when the temperature changes, a formed filter device has a relatively large frequency drift. In the embodiment of the present disclosure, by reducing the thickness of the piezoelectric thin film layer and combining with one substrate layer 201 with a relatively small temperature expansion coefficient, the frequency drift of the filter device can be effectively reduced.

Exemplarily, the thickness of the piezoelectric thin film layer 202 can be set below 20 μm, and the thickness of the substrate layer 201 can be set at about 230 μm.

It will be appreciated that, in the embodiment of the present disclosure, the piezoelectric thin film layer 202 is relatively thin, and has a relatively small contribution to the temperature expansion coefficient of the entire wafer, thus, only a single layer of material same as a substrate material can be used to make the cover plate, so that the temperature expansion coefficient of the cover plate can be close to the temperature expansion coefficient of the wafer. As a result, when the temperature changes, it can prevent deformation of the cover plate and the wafer in different magnitudes due to a large difference between the temperature expansion coefficient of the cover plate and the temperature expansion coefficient of the wafer, which damages the sealed cavity 207. It reduces the influence of temperature changes on the surface acoustic wave filter, thereby effectively enhancing the reliability of the surface acoustic wave filter.

In the embodiment of the present disclosure, the use of wafer level package can effectively reduce the size of the surface acoustic wave filter, which can be suitable for the disclosure in packaging RF front-end module; additionally, the substrate layer and the piezoelectric thin film layer are combined together by wafer bonding, thus the performance of the surface acoustic wave filter based on this type of wafer is less affected by temperature; and the cover plate uses the same material as the substrate layer, thereby also enhancing the overall reliability of the surface acoustic wave filter, and further reducing the influence of temperature changes on the surface acoustic wave filter.

Based on the contents described in the above embodiment, in another embodiment of the present disclosure, the abovementioned cover plate includes at least two material layers, the thickness of each material layer can be flexibly set according to the temperature expansion coefficient of each material layer, so as to reduce the influence of external temperature changes on the entire surface acoustic wave filter.

Figure 3:
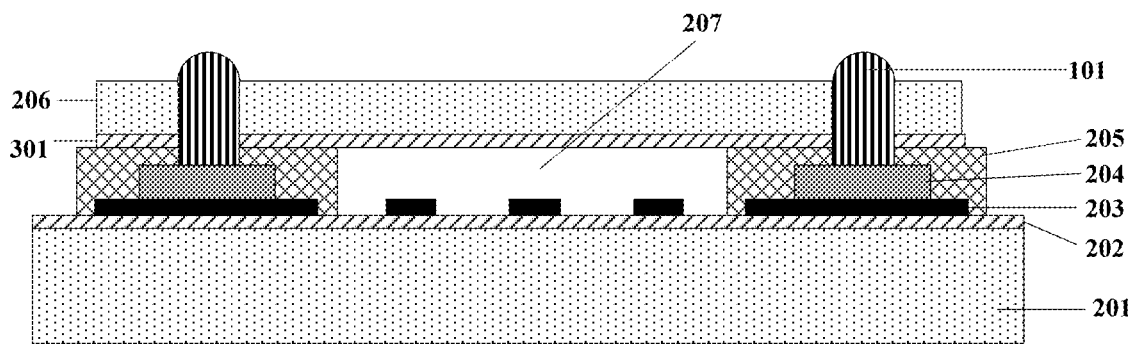
FIG. 3 is a schematic sectional view II of a package structure of a surface acoustic wave filter taken along a section line AB shown in FIG. 1.

Referring to FIG. 3, FIG. 3 is a schematic sectional view II of a package structure of a surface acoustic wave filter taken along a section line AB shown in FIG. 1. In this case, the section shown in FIG. 3 can be considered as a schematic view of a cross-sectional structure of a surface acoustic wave filter.

In FIG. 3, the surface acoustic wave filter includes a wafer, an electrode layer, a supporting wall 205 and a cover plate. In this case, the abovementioned wafer includes a substrate layer 201 and a piezoelectric thin film layer 202, and the substrate layer 201 and the piezoelectric thin film layer 202 are combined together by wafer bonding therebetween.

It should be noted that the thickness of each material layer of the surface acoustic wave filter shown in FIG. 3 is only for exemplary illustration, and does not represent an actual thickness.

The abovementioned electrode layer includes an interdigital electrode 203 and a thickened electrode 204, and the thickened electrode 204 is distributed in at least one of following positions of the interdigital electrode 203: an input position, an output position, and a grounding position. In this case, the interdigital electrode 203 is arranged on a surface of the piezoelectric thin film layer 202.

The supporting wall 205 is located between the piezoelectric thin film layer 202 and the cover plate, and the supporting wall 205 surrounds between the piezoelectric thin film layer 202 and the cover plate to form a sealed cavity 207.

The abovementioned cover plate includes two layers of materials, i.e., a first material layer 206 and a second material layer 301, and the first material layer 206 and the second material layer 301 are combined together by wafer bonding therebetween.

In this case, the second material layer 301 is located on a side of the cover plate close to the sealed cavity 207, and the first material layer 206 uses the same material as the substrate layer 201, and the second material layer 301 uses the same material as the piezoelectric thin film layer 202.

It will be appreciated that, in the embodiment of the present disclosure, the material used for the cover plate is the same as the material used for the wafer, that is, the temperature expansion coefficient of the cover plate can be equal to or very close to the temperature expansion coefficient of the wafer. As a result, when the temperature changes, it can prevent the damage to the sealed cavity 207 due to a large difference between the temperature expansion coefficient of the cover plate and the temperature expansion coefficient of the wafer. It eliminates the influence of temperature changes on such package structure, thereby more effectively enhancing the reliability of the surface acoustic wave filter.

Figure 4:
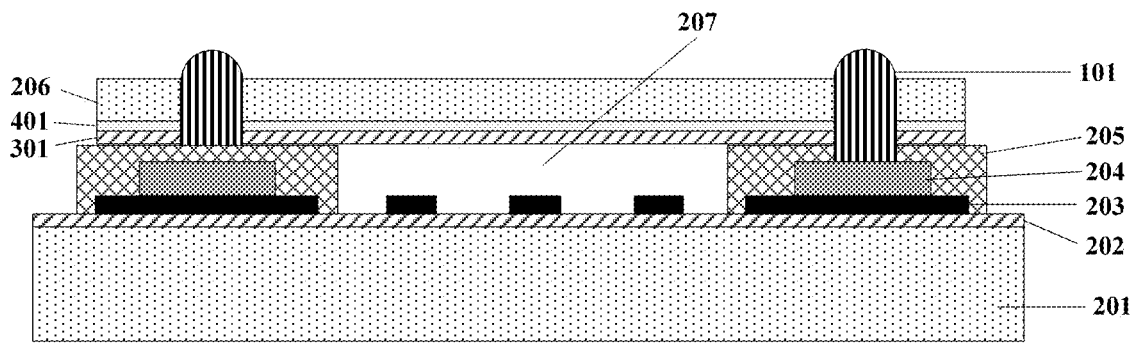
FIG. 4 is a schematic sectional view III of a package structure of a surface acoustic wave filter taken along a section line AB shown in FIG. 1.

Based on the contents described in the above embodiment, referring to FIG. 4, FIG. 4 is a schematic sectional view III of a package structure of a surface acoustic wave filter taken along a section line AB shown in FIG. 1. In this case, the section shown in FIG. 4 can be considered as a schematic view of a cross-sectional structure of a surface acoustic wave filter.

In FIG. 4, the surface acoustic wave filter includes a wafer, an electrode layer, a supporting wall 205 and a cover plate. In this case, the abovementioned wafer includes a substrate layer 201 and a piezoelectric thin film layer 202, and the substrate layer 201 and the piezoelectric thin film layer 202 are combined together by wafer bonding therebetween.

It should be noted that the thickness of each material layer of the surface acoustic wave filter shown in FIG. 4 is only for exemplary illustration, and does not represent an actual thickness.

The abovementioned electrode layer includes an interdigital electrode 203 and a thickened electrode 204, and the thickened electrode 204 is distributed in at least one of following positions of the interdigital electrode 203: an input position, an output position, and a grounding position. In this case, the interdigital electrode 203 is arranged on a surface of the piezoelectric thin film layer 202.

The supporting wall 205 is located between the piezoelectric thin film layer 202 and the cover plate, and the supporting wall 205 surrounds between the piezoelectric thin film layer 202 and the cover plate to form a sealed cavity 207.

The abovementioned cover plate includes three layers of materials, i.e., a first material layer 206, a second material layer 301 and a third material layer 401. In this case, the third material layer 401 is located between the first material layer 206 and the second material layer 301, and the first material layer 206 and the second material layer 301 are combined together by using the third material layer 401.

In this case, the second material layer 301 is located on a side of the cover plate close to the sealed cavity 207; and the first material layer 206 uses the same material as the substrate layer 201, the second material layer 301 uses the same material as the piezoelectric thin film layer 202.

In an implementation, a material used for the third material layer 401 is an organic binder.

In the embodiment of the present disclosure, the thickness of the above three layers of materials can be adjusted and combined flexibly, so as to achieve a temperature expansion coefficient close to that of the bonded wafer. As a result, when the temperature changes, it can also prevent the damage to the sealed cavity 207 due to a large difference between the temperature expansion coefficient of the cover plate and the temperature expansion coefficient of the wafer. It reduces the influence of temperature changes on such package structure, thereby effectively enhancing the reliability of the surface acoustic wave filter.

Figure 5:
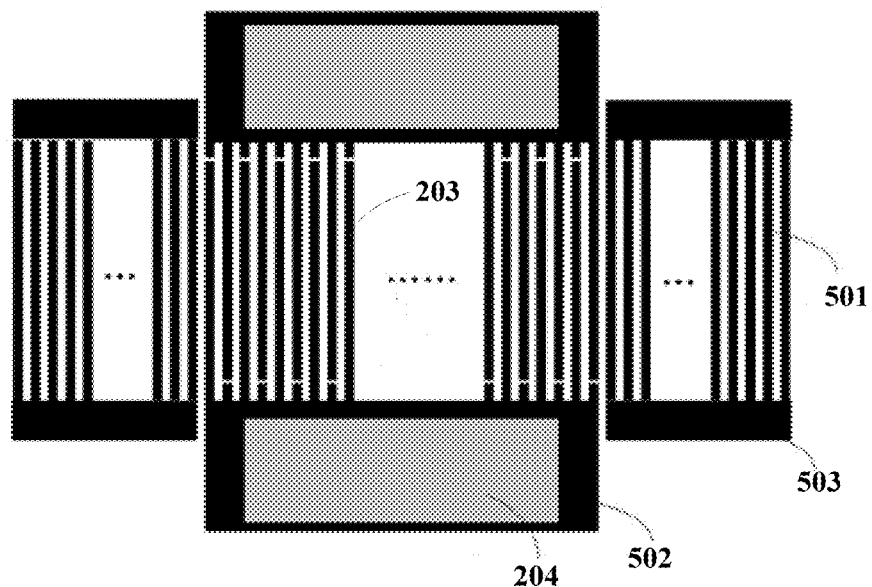
FIG. 5 is a structural schematic view of an electrode layer within a surface acoustic wave filter in an embodiment of the present disclosure.

Based on the contents described in the above embodiment, referring to FIG. 5, FIG. 5 is a structural schematic view of an electrode layer within a surface acoustic wave filter in an embodiment of the present disclosure.

In FIG. 5, the electrode layer includes interdigital electrodes 203 and a thickened electrode 204, both sides of the interdigital electrodes 203 include reflection gratings 501, the bus bar of the interdigital electrodes 203 is a bus bar 502, and the bus bar of the reflection gratings 501 is a bus bar 503. The thickened electrode 204 is distributed on a surface of the bus bar 502.

Since the abovementioned electrode layer has a symmetrical structure, the bus bars 502 of the interdigital electrodes 203 as ports are reciprocal.

Furthermore, in a feasible implementation of the present disclosure, the solder ball 101 penetrates the cover plate and the supporting wall 205 in the TSV manner and then electrically contacts the electrode layer.

In another feasible implementation of the present disclosure, the solder ball 101 is electrically connected with the electrode layer in the RDL manner.

Figure 6:
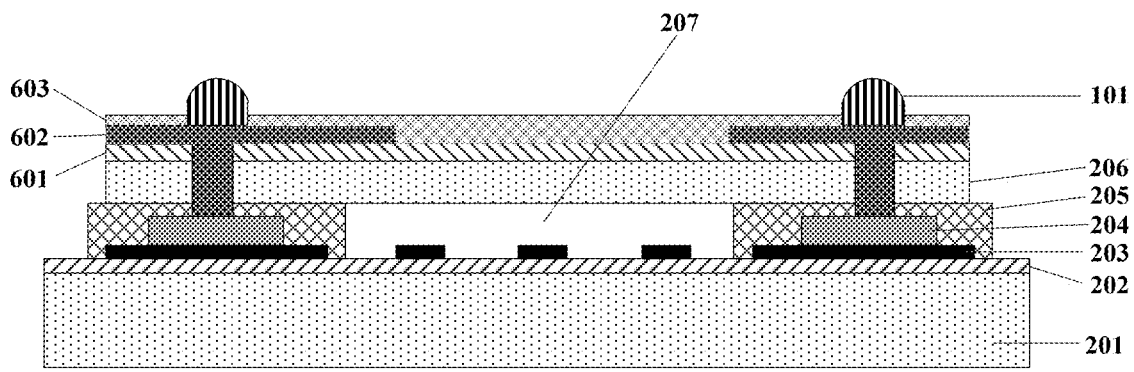
FIG. 6 is a schematic sectional view IV of a package structure of a surface acoustic wave filter taken along a section line AB shown in FIG. 1.

In order to better understand the present disclosure, referring to FIG. 6, FIG. 6 is a schematic sectional view IV of a package structure of a surface acoustic wave filter taken along a section line AB shown in FIG. 1.

In FIG. 6, assuming that the cover plate only includes one layer of material, i.e., the first material layer 206. In this case, when the solder ball 101 is electrically connected with the electrode layer in the RDL manner, the abovementioned surface acoustic wave filter further includes: a first insulating layer 601, a metal wiring layer 602, and a second insulating layer 603.

In this case, the first insulating layer 601 covers a surface of the first material layer 206, the metal wiring layer 602 is arranged on the first insulating layer 601, and the metal wiring layer 602 is in electrical contact with the abovementioned electrode layer; the second insulating layer 603 covers the metal wiring layer 602 and the first insulating layer 601, and the second insulating layer 603 has at least one opening, where the abovementioned metal wiring layer 602 can be exposed at each opening, and the solder balls 101 are filled in each opening and are in electrical contact with the abovementioned metal wiring layer 602.

It will be appreciated that, in FIG. 2 to FIG. 4 the solder balls 101 can be also in electrical contact with the electrode layer in the RDL manner as shown in FIG. 6.

Furthermore, referring to FIG. 7, FIG. 7 is a transversely sectional view of a surface acoustic wave filter in an embodiment of the present disclosure.

In FIG. 7, 701 represents metal wirings, 702 represents a resonator, 202 represents a piezoelectric thin film layer, 203 represents an interdigital electrode, 204 represents a thickened electrode, 205 represents a supporting wall, and 101 represents a solder ball. The interdigital electrode 203 and the thickened electrode 204 utilize the solder balls 101 to achieve the electrical connection with external devices.

It will be appreciated that, the wiring manner shown in FIG. 7 is only for exemplary illustration, and the purpose is to better understand the embodiments of the present disclosure, and does not represent actual wiring manners such as routing or connection.

Furthermore, based on the contents described in the above embodiment, an embodiment of the present disclosure further provides a package method for a wafer level surface acoustic wave filter. Referring to FIG. 8, FIG. 8 is a schematic flow diagram I of a package method for a wafer level surface acoustic wave filter in an embodiment of the present disclosure, where the method includes:

S801: obtaining a wafer, where the wafer includes a substrate layer and a piezoelectric thin film layer, and the substrate layer and the piezoelectric thin film layer are combined together by wafer bonding therebetween;

S802: preparing an electrode layer on the piezoelectric thin film layer;

S803: preparing a supporting wall on the piezoelectric thin film layer;

S804: obtaining a cover plate, where the cover plate includes a first material layer, and the first material layer uses the same material as the substrate layer;

S805: sealing the supporting wall and the cover plate, so that the supporting wall surrounds between the piezoelectric thin film layer and the cover plate to form a sealed cavity.

In this case, a via hole which penetrates the cover plate and the supporting wall is formed in a through silicon via (TSV) manner at a preset position of the cover plate; and a solder ball is implanted in the via hole by electroplating, the solder ball electrically contacts the electrode layer.

In a feasible implementation, a ratio of a thickness of the piezoelectric thin film layer to that of the wafer is less than a preset threshold. In an implementation, a value of the preset threshold is 0.1.

It will be appreciated that, in the embodiment of the present disclosure, the piezoelectric thin film layer 202 is relatively thin, and has a relatively small contribution to the temperature expansion coefficient of the entire wafer, thus, only a single layer of material same as a substrate material can be used to make the cover plate, so that the temperature expansion coefficient of the cover plate can be close to the temperature expansion coefficient of the wafer. As a result, when the temperature changes, it can prevent deformation of the cover plate and the wafer in different magnitudes due to a large difference between the temperature expansion coefficient of the cover plate and the temperature expansion coefficient of the wafer, which damages the sealed cavity 207. It reduces the influence of temperature changes on the surface acoustic wave filter, thereby effectively enhancing the reliability of the surface acoustic wave filter.

The package method for a wafer level surface acoustic wave filter provided by the embodiment of the present disclosure uses wafer level package, which can effectively reduce the size of the surface acoustic wave filter; additionally, since the substrate layer and the piezoelectric thin film layer are combined together by wafer bonding, the performance of the surface acoustic wave filter based on this type of wafer is less affected by temperature; meanwhile, the cover plate uses the same material as the substrate material, so that the temperature expansion coefficient of the cover plate can be the same as the temperature expansion coefficient of the wafer. As a result, when the temperature changes, it can prevent the damage to the sealed cavity due to a large difference between the temperature expansion coefficient of the cover plate and the temperature expansion coefficient of the wafer. It reduces the influence of temperature changes on the surface acoustic wave filter, thereby effectively enhancing the reliability of the surface acoustic wave filter.

Based on the contents described in the above embodiment, in another embodiment of the present disclosure, the abovementioned cover plate includes at least two material layers, and a thickness of each material layer is related to a temperature expansion coefficient of each material layer.

Figure 9:
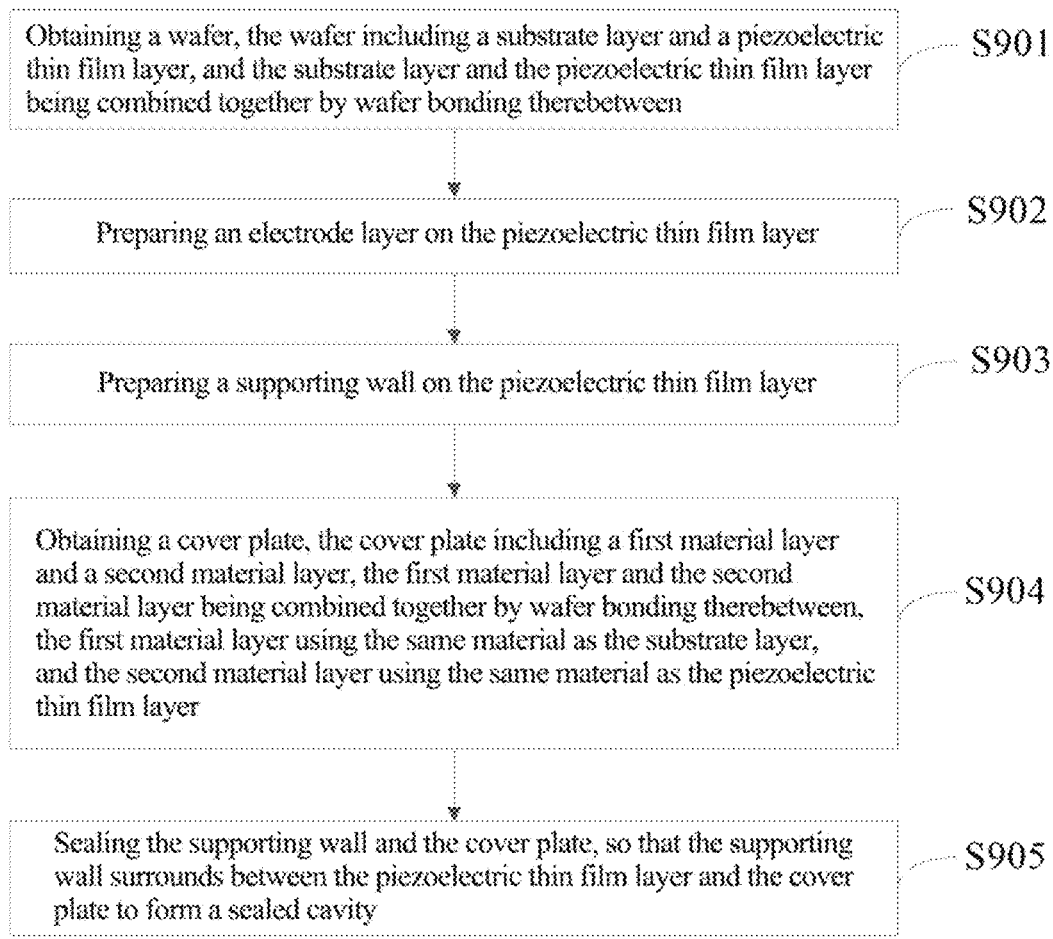
FIG. 9 is a schematic flow diagram II of a package method for a wafer level surface acoustic wave filter in an embodiment of the present disclosure.

Referring to FIG. 9, FIG. 9 is a schematic flow diagram II of a package method for a wafer level surface acoustic wave filter in an embodiment of the present disclosure, where the method includes:

S901: obtaining a wafer, where the wafer includes a substrate layer and a piezoelectric thin film layer, and the substrate layer and the piezoelectric thin film layer are combined together by wafer bonding therebetween;

S902: preparing an electrode layer on the piezoelectric thin film layer;

S903: preparing a supporting wall on the piezoelectric thin film layer;

S904: obtaining a cover plate, where the cover plate includes a first material layer and a second material layer, the first material layer and the second material layer are combined together by wafer bonding therebetween, the first material layer uses the same material as the substrate layer, and the second material layer uses the same material as the piezoelectric thin film layer;

S905: sealing the supporting wall and the cover plate, so that the supporting wall surrounds between the piezoelectric thin film layer and the cover plate to form a sealed cavity.

In the package method for a wafer level surface acoustic wave filter provided by the embodiment of the present disclosure, the material used for the cover plate is the same as the material used for the wafer, that is, the temperature expansion coefficient of the cover plate can be equal to or very close to the temperature expansion coefficient of the wafer. As a result, when the temperature changes, it can prevent the damage to the sealed cavity due to a large difference between the temperature expansion coefficient of the cover plate and the temperature expansion coefficient of the wafer. It eliminates the influence of temperature changes on such package structure, thereby more effectively enhancing the temperature stability of the surface acoustic wave filter.

Figure 10:
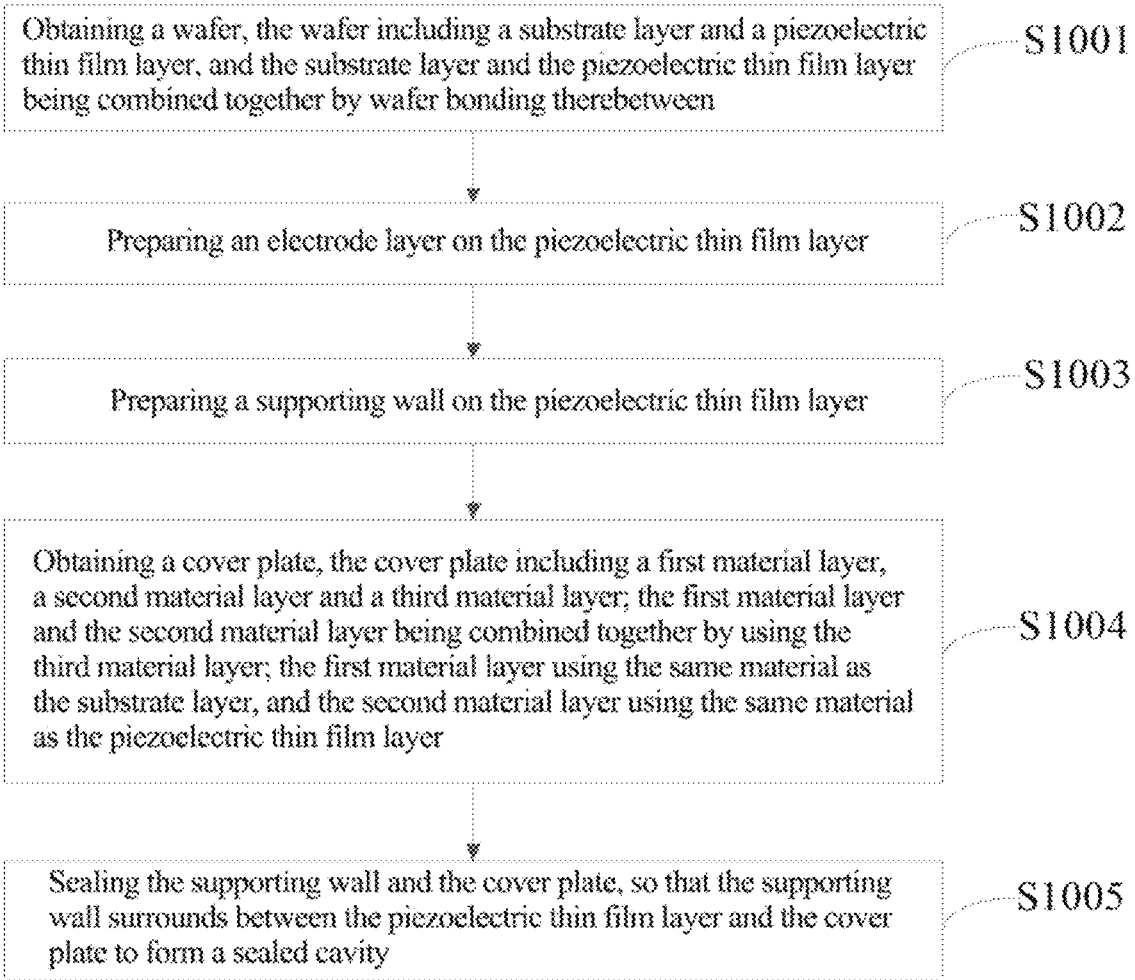
FIG. 10 is a schematic flow diagram III of a package method for a wafer level surface acoustic wave filter in an embodiment of the present disclosure.

Based on the contents described in the above embodiment, in yet another embodiment of the present disclosure, referring to FIG. 10, FIG. 10 is a schematic flow diagram III of a package method for a wafer level surface acoustic wave filter in an embodiment of the present disclosure, where the method includes:

S1001: obtaining a wafer, where the wafer includes a substrate layer and a piezoelectric thin film layer, and the substrate layer and the piezoelectric thin film layer are combined together by wafer bonding therebetween;

S1002: preparing an electrode layer on the piezoelectric thin film layer;

S1003: preparing a supporting wall on the piezoelectric thin film layer;

S1004: obtaining a cover plate, where the cover plate includes a first material layer, a second material layer and a third material layer; the first material layer and the second material layer are combined together by using the third material layer; the first material layer uses the same material as the substrate layer, and the second material layer uses the same material as the piezoelectric thin film layer;

S1005: sealing the supporting wall and the cover plate, so that the supporting wall surrounds between the piezoelectric thin film layer and the cover plate to form a sealed cavity.

In the package method for a wafer level surface acoustic wave filter provided by the embodiment of the present disclosure, the thickness of the above three layers of materials can be adjusted and combined flexibly, so as to achieve a temperature expansion coefficient close to that of the bonded wafer. As a result, when the temperature changes, it can also prevent the damage to the sealed cavity due to a large difference between the temperature expansion coefficient of the cover plate and the temperature expansion coefficient of the wafer. It reduces the influence of temperature changes on such package structure, thereby effectively enhancing the temperature stability of the surface acoustic wave filter.

The above embodiments are only used to illustrate the technical solutions of the present disclosure, but not to limit them. Although the present disclosure has been described in detail with reference to the above embodiments, those skilled in the art should understand that they can still make modifications to the technical solutions recorded in the above embodiments, or equivalent substitutions to some or all of the technical features therein, and these modifications or substitutions do not make the essential of the corresponding technical solutions depart from the scope of the technical solutions in the embodiments according to the present disclosure.

What is claimed is:

1. A wafer level surface acoustic wave filter, comprising: a wafer, an electrode layer, a supporting wall and a cover plate; wherein the wafer comprises a substrate layer and a piezoelectric thin film layer, and the substrate layer and the piezoelectric thin film layer are combined together by wafer bonding therebetween;

the electrode layer is arranged on a surface of the piezoelectric thin film layer, the supporting wall is located between the piezoelectric thin film layer and the cover plate, and the supporting wall surrounds an area between the piezoelectric thin film layer and the cover plate to form a sealed cavity;

the cover plate comprises a first material layer and a second material layer, the first material layer and the second material layer are combined together by wafer bonding therebetween; the second material layer is located on a side of the cover plate close to the sealed cavity; the first material layer uses a same material as the substrate layer, and the second material layer uses a same material as the piezoelectric thin film layer;

wherein a ratio of a thickness of the piezoelectric thin film layer to a thickness of the wafer is less than 0.1.

2. The wafer level surface acoustic wave filter according to claim 1, wherein the cover plate comprises at least two material layers, and a thickness of each material layer is related to a temperature expansion coefficient of each material layer, wherein the at least two material layers comprise the first material layer and the second material layer.

3. The wafer level surface acoustic wave filter according to claim 1, wherein the electrode layer comprises an interdigital electrode and a thickened electrode, and the thickened electrode is distributed in at least one of following positions of the interdigital electrode: an input position, an output position, and a grounding position.

4. The wafer level surface acoustic wave filter according to claim 3, further comprising at least one solder ball, wherein the at least one solder ball penetrates the cover plate and the supporting wall in a through silicon via (TSV) manner and then electrically contacts the electrode layer;

or, the at least one solder ball is electrically connected with the electrode layer in a redistribution layer (RDL) manner.

5. The wafer level surface acoustic wave filter according to claim 1, wherein the piezoelectric thin film layer is made from at least one of following materials: lithium tantalate LiTaO3 and lithium niobate LiNbO3.

6. The wafer level surface acoustic wave filter according to claim 1, wherein the substrate layer is made from at least one of following materials: silicon Si and sapphire.

7. A package method for a wafer level surface acoustic wave filter, comprising:

obtaining a wafer, the wafer comprising a substrate layer and a piezoelectric thin film layer, and the substrate layer and the piezoelectric thin film layer being combined together by wafer bonding therebetween;

preparing an electrode layer on the piezoelectric thin film layer;

preparing a supporting wall on the piezoelectric thin film layer;

obtaining a cover plate, the cover plate comprising a first material layer and a second material layer, the first material layer and the second material layer being combined together by wafer bonding therebetween; the second material layer being located on a side of the cover plate close to a sealed cavity; the first material layer using a same material as the substrate layer, and the second material layer using a same material as the piezoelectric thin film layer; and sealing the supporting wall and the cover plate, so that the supporting wall surrounds an area between the piezoelectric thin film layer and the cover plate to form the sealed cavity;

wherein a ratio of a thickness of the piezoelectric thin film layer to a thickness of the wafer is less than 0.1.

8. The package method according to claim 7, wherein the cover plate comprises at least two material layers, and a thickness of each material layer is related to a temperature expansion coefficient of each material layer, wherein the at least two material layers comprise the first material layer and the second material layer.

9. The package method according to claim 8, wherein the cover plate comprises the first material layer, the second material layer and a third material layer; wherein the third material layer is located between the first material layer and the second material layer, and the first material layer and the second material layer are combined together by using the third material layer.

10. The package method according to claim 7, further comprising:

forming a via hole which penetrates the cover plate and the supporting wall in a through silicon via (TSV) manner at a preset position of the cover plate, and implanting a solder ball in the via hole by electroplating, the solder ball electrically contacting the electrode layer.

11. A wafer level surface acoustic wave filter, comprising: a wafer, an electrode layer, a supporting wall and a cover plate; wherein the wafer comprises a substrate layer and a piezoelectric thin film layer, and the substrate layer and the piezoelectric thin film layer are combined together by wafer bonding therebetween;

the electrode layer is arranged on a surface of the piezoelectric thin film layer, the supporting wall is located between the piezoelectric thin film layer and the cover plate, and the supporting wall surrounds an area between the piezoelectric thin film layer and the cover plate to form a sealed cavity;

the cover plate comprises a first material layer, a second material layer and a third material layer; wherein the third material layer is located between the first material layer and the second material layer, and the first material layer and the second material layer are combined together by using the third material layer; the second material layer is located on a side of the cover plate close to the sealed cavity; and the first material layer uses a same material as the substrate layer, the second material layer uses a same material as the piezoelectric thin film layer;

wherein a ratio of a thickness of the piezoelectric thin film layer to a thickness of the wafer is less than 0.1.

12. The wafer level surface acoustic wave filter according to claim 11, wherein a material used for the third material layer is an organic binder.

* * * * *